United States Patent [19]
Amemiya et al.

[11] Patent Number: 5,604,779
[45] Date of Patent: Feb. 18, 1997

[54] OPTICAL EXPOSURE METHOD AND DEVICE FORMED BY THE METHOD

[75] Inventors: Mitsuaki Amemiya, Utsunomiya; Yutaka Watanabe, Isehara, both of Japan

[73] Assignee: Canon Kabushiki Kaisha, Tokyo, Japan

[21] Appl. No.: 455,154

[22] Filed: May 31, 1995

[30] Foreign Application Priority Data

Jun. 7, 1994 [JP] Japan .................................. 6-125104
Mar. 23, 1995 [JP] Japan .................................. 7-064158

[51] Int. Cl.$^6$ .................................................. H01L 21/30
[52] U.S. Cl. ........................................... 378/34; 378/146
[58] Field of Search .................................... 378/34, 146

[56] References Cited

U.S. PATENT DOCUMENTS

| | | | |
|---|---|---|---|
| 4,028,547 | 6/1977 | Eisenberger | 378/34 |
| 4,748,646 | 5/1988 | Osada et al. | 378/34 |
| 4,856,037 | 8/1989 | Mueller et al. | 378/34 |
| 5,115,456 | 5/1992 | Kimura et al. | 378/34 X |
| 5,123,036 | 6/1992 | Uno et al. | 378/34 |
| 5,125,014 | 6/1992 | Watanabe et al. | 378/34 |
| 5,131,022 | 7/1992 | Terashima et al. | 378/34 |
| 5,172,403 | 12/1992 | Tanaka et al. | 378/34 |
| 5,377,251 | 12/1994 | Mizusawa et al. | 378/34 |

*Primary Examiner*—David P. Porta
*Attorney, Agent, or Firm*—Fitzpatrick, Cella, Harper & Scinto

[57] ABSTRACT

A transfer magnification correcting method suited for use in scanning exposure by use of synchrotron radiation or the like. In proximity exposure according to the scanning exposure method by use of synchrotron radiation, the magnification in the scanning direction is corrected by relatively moving a wafer and a mask simultaneously with the scanning. Also, the overall correction of the magnification is performed by changing a proximity gap or adjusting the temperature of the mask or the wafer. As a result, it is possible to correct the transfer magnification separately in the vertical and horizontal directions.

14 Claims, 7 Drawing Sheets

DEVICE MANUFACTURING FLOW

WAFER PROCESS

OPTICAL EXPOSURE METHOD AND DEVICE FORMED BY THE METHOD

BACKGROUND OF THE INVENTION

1. Field of the Invention

The present invention relates to an optical exposure technique of exposing a mask and a wafer to a radiation beam, such as a synchrotron radiation beam or the like, so as to transfer a mask pattern onto the wafer.

2. Description of the Related Art

Conventionally, in an optical exposure process employed whereby a mask and a wafer are exposed to light so as to transfer a mask pattern formed on the mask to the wafer, the temperature of a wafer chuck for holding the wafer by suction is changed to extend or contract the wafer, thereby performing the correction of the magnification. However, in the proximity exposure method through the use of an X-ray having a shorter wavelength, an X-ray transmission film of the X-ray mask having a pattern to be transferred formed thereon is held on the wafer with only a small gap of several dozens of μm. Also, the X-ray mask has a small specific heat. Consequently, a change in the temperature of the wafer entails a change in the temperature of the mask, which further unavoidably causes the extension or the contraction of the mask.

In order to overcome the above-described drawback, the following method of correcting the transfer magnification has been suggested. That is, a gap between the mask and the wafer (a proximity gap) is relatively changed, or alternatively, the temperature of the wafer or the mask is varied.

The following three types of exposure methods of performing the scanning exposure are known in the lithographic technology by use of a synchrotron radiation beam.

(1) An X-ray mirror is rocked (rotated) to allow a sheet beam-like synchrotron radiation beam to undergo deviation.

(2) A mask and a wafer are integrally moved in relation to a sheet beam which is fixed to be oriented.

(3) A shutter having a predetermined-width opening is moved in relation to a divergent beam which is fixed to be oriented.

However, whichever method is employed, there is a difference in the divergent angle of the beam between the scanning direction (Y direction) and the direction orthogonal thereto (X direction), disadvantageously resulting in a disparity in the transfer magnification between the X and Y directions. Further, when the synchrotron radiation beam is converged in the X direction through the use of a convergent optical system, a difference in the diverging angle of the beam is produced between the X and Y directions, also resulting in a disparity in the transfer magnification between the X and Y directions.

Because of the above-described problem, the separate correction of the magnification in the X and Y directions cannot be achieved merely by changing the proximity gap or the temperature of the wafer or the mask, thus failing to correct a disparity in the magnification between the X and Y directions.

SUMMARY OF THE INVENTION

Accordingly, in order to solve the above-described problem inherent in the related art, an object of the present invention is to provide a method of correcting the transfer magnification best suited to the scanning exposure so as to realize a highly-accurate exposure process. Another object of the present invention is to provide an exposure method in which the correction of the magnification in the scanning direction and the direction orthogonal thereto can be set as desired.

In a preferred form of the present invention, there is provided a method of transferring a pattern formed on a mask to a wafer, comprising the steps of: holding the mask and the wafer in a predetermined relation to each other; performing beam scanning in relation to the mask and the wafer; and relatively inching the wafer and the mask in the scanning direction simultaneously with the beam scanning. With this arrangement, the correction of the magnification can be independently performed only in the scanning direction.

Further objects, features and advantages of the present invention will become apparent from the following description of the preferred embodiments with reference to the attached drawings.

DETAILED DESCRIPTION OF THE PREFERRED EMBODIMENTS

Prior to a description of specific embodiments, an explanation will first be given of a theory of an optical exposure method according to the present invention. According to a method of optically exposing a wafer and a mask which are placed in proximity to each other while being relatively scanned by a beam, the wafer and the mask are relatively moved or inched in the scanning direction synchronously with the beam scanning, thereby independently making a correction to the magnification only in the beam scanning direction. Also, before making the above-described correction, the proximity gap between the mask and the wafer is varied, or the temperature of the wafer or the mask is adjusted, thereby simultaneously correcting the magnification both in the scanning direction and in the direction orthogonal thereto. Hence, by a combination of the above-described two steps, it is possible to correct the magnification of the mask separately in the vertical and horizontal directions.

Figure 1A:
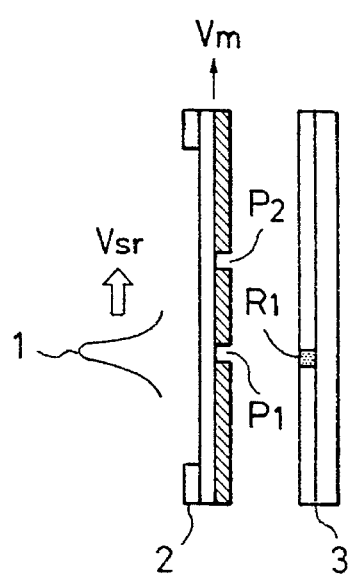
FIGS. 1(*a*) and 1(*b*) illustrate the theory of the present invention.
Figure 1B:
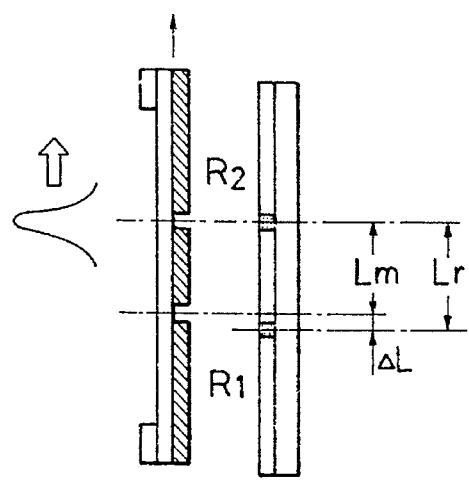

FIG. 1(*a*) illustrates a slit-like synchrotron radiation sheet beam 1 exposing an X-ray mask 2 and a resist-coated wafer 3 while moving on the X-ray mask 2 at a velocity of $V_{sr}$ in the direction indicated by the arrow in FIG. 1 (*a*) so as to transfer patterns $P_1$ and P2 formed on the mask 2 onto the wafer 3. During this exposure and transfer step, the X-ray mask 2 is moved at a predetermined velocity $V_m$ synchronously with the radiation beam 1. The radiation beam 1 is applied to the pattern $P_1$ formed on the mask 2 so that $R_1$ is transferred onto the wafer 3. Subsequently, the radiation beam 1 is moved to illuminate the pattern $P_2$ so that $R_2$ is projected onto the wafer 3, as illustrated in FIG. 1(b). The distance $L_r$ between $R_1$ and $R_2$ equals a value obtained by adding the displacement $\Delta L$ of the mask 2 to the distance $L_m$ between the patterns $P_1$ and $P_2$.

The enlargement ratio my required for achieving the correction of the magnification can be expressed by the following equation:

$$m_y=(L_m+L)/L_m$$

The displacement $\Delta L$ of the mask can further be expressed by the following equation:

$$\Delta L=V_m/V_{sr}\times(L_m/(1-V_m/V_{sr}))$$

Since $V_m$ is much smaller than $V_{sr}$, i.e., $V_m \ll V_{sr}$, the enlargement ratio my can be expressed by the following equation:

$$m_y=1+V_m/V_{sr} \quad (1)$$

On the other hand, when reduction is desired, the mask 2 should be moved in the direction opposite to the movement of the radiation beam 1, i.e., the mask 2 is moved at a velocity of $V_m$ in the negative direction. Since it is essential only that the mask 2 and the wafer 3 be relatively moved in order to achieve the correction of the magnification, the wafer 3 may be moved instead of the mask 2, or alternatively, both the mask and wafer may be moved at different levels of velocity.

Figure 2A:
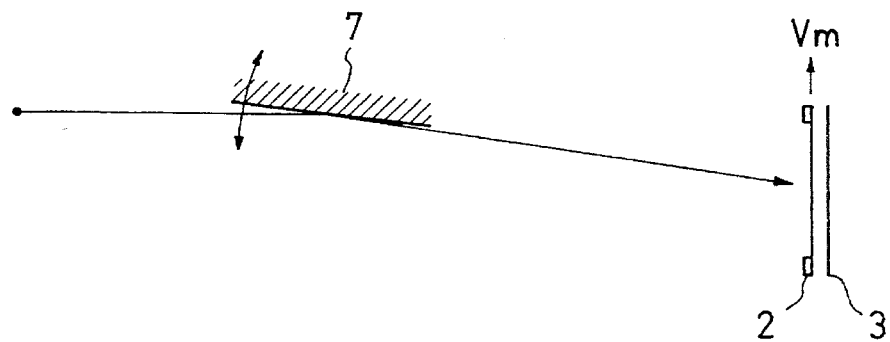
FIGS. 2(*a*) and 2(*b*) illustrate the divergent angle obtained in the proximity exposure method.
Figure 2B:
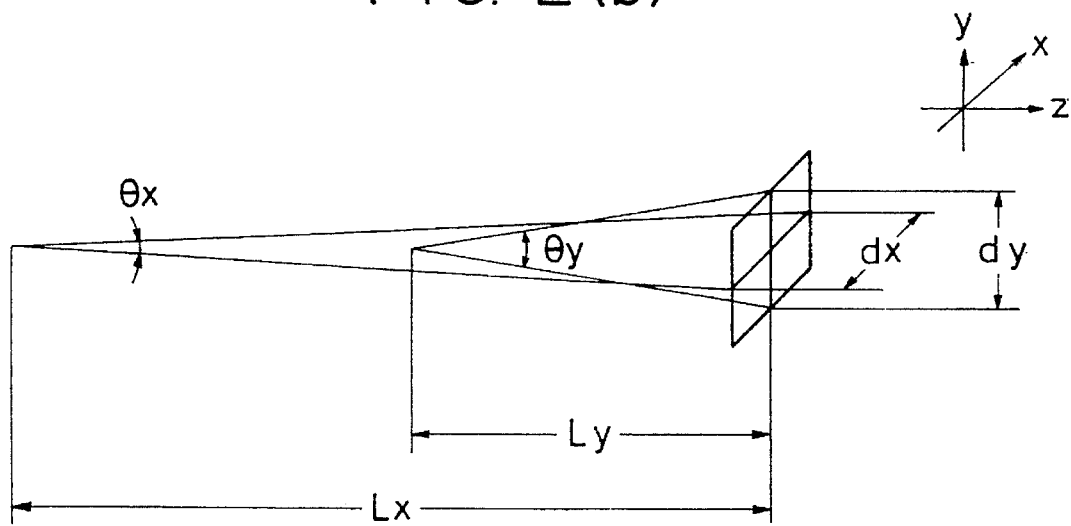

FIGS. 2(a) and 2(b) illustrate the correction of the magnification by changing the proximity gap. As shown in FIG. 2(a), when an X-ray mirror 7 is rocked to extend the irradiation area in the Y direction, the divergent angle of the synchrotron radiation beam applied to the mask 2 in the horizontal direction (the X direction) differs from that in the vertical direction (the Y direction), as illustrated in FIG. 2(b), which angles can be expressed by $\theta_x=d_x/L_x$ and $\theta_y=d_y/L_y$, respectively, where $d_x$ and $d_y$ indicate exposure areas in the X and Y directions, respectively; $L_x$ represents the distance between the light emitting point and the mask 2; and $L_y$ indicates the distance between the X-ray mirror and the mask 2. The proximity gap is changed to vary the magnification in the Y direction (the scanning direction of the radiation beam), as well as the magnification in the X direction (the direction orthogonal to the scanning direction).

In view of the above-described background, a description will now be given of a method of correcting the magnification so as to achieve the enlargement ratios $m_x$ and $m_y$ in the X and Y directions, respectively.

The proximity gap is first changed in order to obtain a desired correction amount of the magnification in the X direction, which simultaneously entails a change in the magnification in the Y direction. However, as described above, since it is possible to make an independent correction to the magnification only in the Y direction, it will be performed after changing the proximity gap. Such a combination of two steps of the correcting operation will now be explained in more detail.

Initially, for making a correction to the magnification in the X direction, the proximity gap is changed by an amount expressed by the following equation:

$$\Delta g=(m_x-1)\times L_x \quad (2)$$

In accordance with a change in the proximity gap, the enlargement ratio $m'_y$ in the Y direction is also changed by an amount expressed by the following equation:

$$m'_y=1+\Delta g/L_y \quad (3)$$

Since $m'_y$ is unrelated to $m_y$, a desired correction amount in the Y direction cannot be obtained without performing further correction.

Thus, as described above, the mask is moved relative to the wafer synchronously with the movement of the scanning beam so that the correction of the magnification can be independently carried out only in the Y direction.

The velocity $V_m$ at which the mask is moved should be determined by the equations (1) and (3) so that it can satisfy the following equation:

$$m_y=m'_y\times m_v=m'_y\times(1+V_m/V_{sr})=(1+\Delta g/L_y)\times(1+V_m/V_{sr})$$

As a consequence, the velocity $V_m$ can be expressed by the following equation:

$$V_m=V_{sr}\times(m_y/(1+\Delta g/L_y)-1) \quad (4)$$

The displacement of the X-ray mask in relation to the wafer during exposure produces an adverse influence on the printing linewidth of the resist. An apparent increase $\Delta W_p$ in linewidth of the mask pattern during exposure can be expressed by the following equation:

$$\Delta W_p=|W_{sr}\times V_m/V_{sr}|$$

where $W_{sr}$ indicates the width of the sheet beam in the beam scanning direction. The enlargement ratio $m_y$ in the foregoing equation (1) is substituted into the above-described equation to further obtain the following equation:

$$\Delta W_p=|W_{sr}\times(m_v-1)|$$

For example, when it is desired that a 0.25 μm-width pattern be transferred to the wafer, the width of the sheet beam $W_{sr}$ is set to be 5 mm, considering that a tolerance of an increase in the mask pattern should be contained up to one-fifth of the pattern width. Thus, the maximum correction value of the enlargement ratio should be 10 ppm.

Conversely, upon determination of the phase velocity of the sheet beam $V_{sr}$ and the mask velocity $V_m$, the width of the sheet beam $W_{sr}$ should be expressed by the following equation:

$$W_{sr}=\Delta W_p\times V_{sr}/V_m \quad (5)$$

When the width of the sheet beam radiating from a light source is greater than the value $W_{sr}$ calculated in the above-described equation (5), it is necessary to narrow the width of the sheet beam by any suitable means. One of the means is to dispose an aperture having a predetermined width on the upstream side of a mirror so as to restrict the width of the sheet beam.

Specific embodiments will now be explained.

First Embodiment

Figure 3:
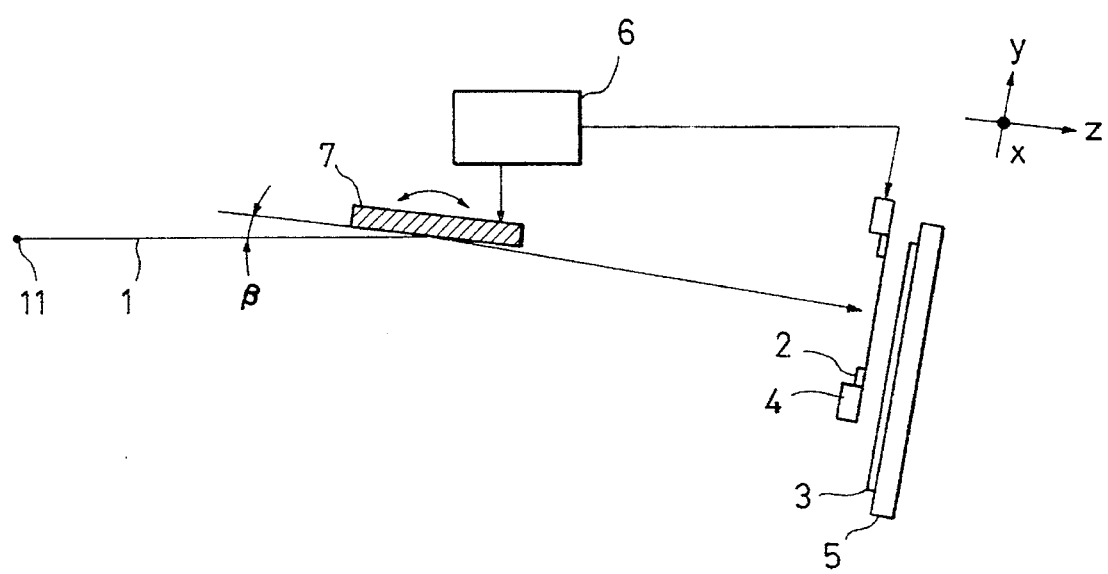
FIG. 3 illustrates an exposure apparatus according to one embodiment of the present invention.

FIG. 3 illustrates an exposure apparatus of a first embodiment. The sheet-beam radiation beam 1 radiated from the light emission point 11 is obliquely incident on the X-ray mirror 7 so as to be reflected. Based on an instruction from a controller 6, the X-ray mirror 7 is rocked at a predetermined velocity. In accordance with a change in the grazing angle β of the incident light on the X-ray mirror 7 due to the rocking of the mirror 7, the slit-like radiation beam 1 is moved on the mask 2 at the velocity $V_{sr}$ so as to scan the entire exposure area on the mask 2. This scanning allows a transfer pattern formed on the mask 2 to be projected on the resist-coated wafer 3, thus completing an exposure and transfer process. The X-ray mask 2 is held on a mask stage 4 so as to be movable both in the Y and Z directions. Also, the wafer 3 is held on a wafer stage 5 so as to be movable both in the X and Y directions. The movements of the respective stages are performed upon instruction of the controller 6.

In the exposure apparatus constructed as described above, a correction can be made to the transfer magnification by the following process.

(1) Calculation of a correction value of the magnification

The process distortion of the wafer 3 is first measured, which measurement can be conducted by means such as measuring the distance between a plurality of alignment marks on the wafer by an alignment optical system.

If the distance between the two patterns on the wafer is $L'_w$, which should be inherently $L_w$, and if the process distortion $L'_w - L_w$ exceeds a predetermined tolerance, it is necessary that the magnification be corrected. The required correction value m can be indicated by $L'_w/L_w$.

For example, it will now be assumed that the correction value of the magnification in the X direction is equal to that in the Y direction, and that the design value L is 30.000 mm and the measured value is 30.00003 mm. Since the correction value of the magnification $m_x$ in the X direction equals that of the magnification $m_y$ in the Y direction, i.e., $m=m_x=m_y$, the following equation can be established: $m-1=1E-6$. The distance $L_x$ between the light emission point 11 and the mask 2 is 5 m; the distance $L_y$ between the X-ray mirror 7 and the mask 2 is 2.5 m; and the set proximity gap is 30 μm.

(2) Correction of the magnification in the X direction (a change in the proximity gap)

The magnification in the X direction is corrected by changing the proximity gap. The following equations: $m_x-1=1.0E-6$ and $L_x=5$ m are substituted into the equation (2) so as to obtain a change in the proximity gap $\Delta g$ of 5 μm.

(3) Determination of mask Velocity

When the radiation beam 1 moves on the mask 2 at a velocity $V_{sr}$ of 50.0 (mm/sec) and exposure can be performed by scanning only one time, the velocity $V_m$ of −0.05 (μm/sec) of the mask 2 can be calculated according to the above-described equation (5). Thus, the mask is moved at a velocity of 0.05 (μm/sec) in the direction opposite to the movement of the radiation beam during exposure. (4) Correction of the magnification in the Y direction (mask movement)

Figure 4:
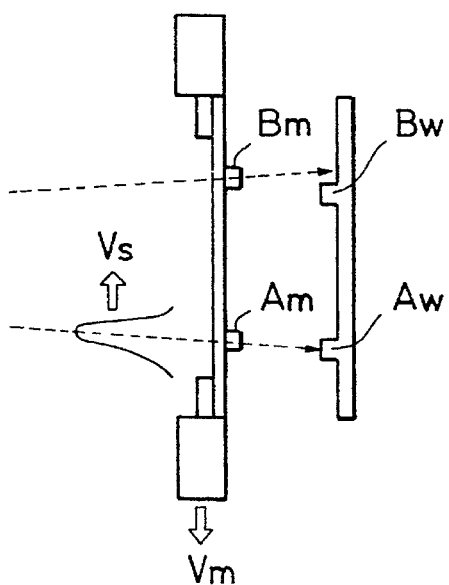
FIG. 4 illustrates the operation of the exposure apparatus of the same embodiment.

As shown in FIG. 4, the patterns $A_m$ and $B_m$ formed on the mask will be overlaid on the patterns $A_w$ and $B_w$ which have been printed on the wafer. The bottom portion of the mask is positioned to that of the wafer so that the position of the pattern $A_m$ to be transferred to the wafer is aligned to the pattern $A_w$ on the wafer. However, the pattern $B_m$ at the top portion of the mask is displaced from the pattern $B_w$ at the top portion of the wafer by an amount in which a correction has not been achieved by a change in the proximity gap. For making further correction to such a displacement, the mask stage 4 should be controlled to move the mask at a previously-obtained velocity $V_m$ of −0.05 (μm/sec) during scanning exposure.

In this embodiment, the permissible width $W_{sr}$ of the scanning beam can be determined to be 50 mm according to the foregoing equation (5), which value is greater than the width of a typical synchrotron radiation beam, 10 mm. Thus, it is not necessary to restrict the width of the scanning beam.

This embodiment has been explained by way of example in which the mask is moved during scanning exposure. However, since it is only essential to perform a relative movement between the mask and the wafer in the scanning direction during scanning exposure, the wafer may be moved instead of the mask, or both the mask and wafer may be moved at different levels of velocity.

When it is desired that the exposure be performed by reciprocating the radiation beam on the mask a plurality of times, it is necessary that the mask be moved in the same direction as that of the movement of the radiation beam, i.e., when the radiation beam reverses its direction, the mask should follow suit. This can be accomplished under the control of the rocking of the mirror 7 and the movement of the mask stage 4 by the controller 6.

Second Embodiment

Figure 5:
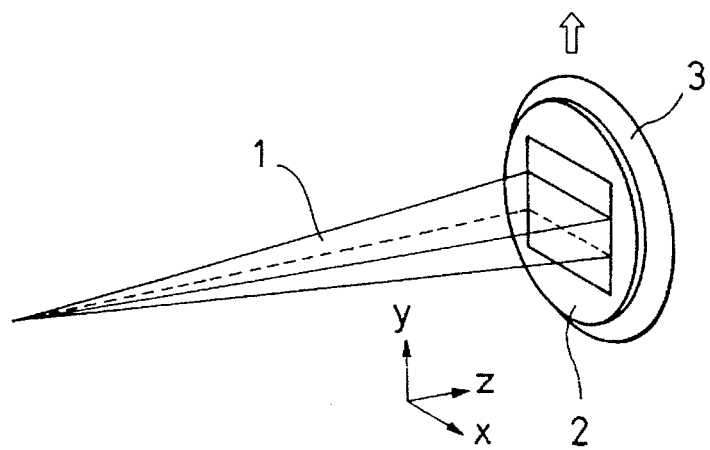
FIG. 5 illustrates an exposure apparatus according to another embodiment of the present invention.

A description will now be given of an embodiment of an exposure apparatus for performing exposure by integrally moving both the wafer and mask. As shown in FIG. 5, in this apparatus, the mask 2 and the wafer 3 are integrally moved with respect to the thin sheet-like synchrotron radiation beam 1 which is fixed to be oriented so that the radiation beam 1 can substantially scan the mask 2, with the result that the mask 2 and the wafer 3 can be exposed so as to transfer the mask pattern to the wafer 3.

Referring to FIG. 5, the magnification can be corrected in the X direction by changing the proximity gap, but it cannot be corrected in the Y direction (the scanning direction) even by changing the proximity gap because the incident angle of the radiation beam with respect to the mask is integrated due to scanning. Thus, it should be considered that the distance $L_y$ be infinity in the above-described equation (4).

A correction will be made to the magnification in this embodiment by the following process.

(1) Calculation of a correction value of the magnification

In this embodiment, as well as the first embodiment, the correction value of the magnification is first measured. Upon this measurement, it will now be assumed, for example, that the magnification $m_x$ in the X direction has measured $m_x1=1.0E-6$ and that the magnification $m_y$ in the Y direction has measured $m_y-1=2.0E-6$.

(2) Correction of the magnification in the X direction (a change in the proximity gap)

The magnification in the X direction is corrected by changing the proximity gap. The following equations: $m_x-1=1.0E-6$ and $L_x=5$ m are substituted into the equation (2) so as to obtain a change in the proximity gap $\Delta g$ of 5 μm.

(3) Correction of the magnification in the Y direction (determination of the mask velocity and the mask movement)

If the following two conditions are satisfied: the beam scanning speed, a velocity $V_{sr}$ of 50.0 (mm/sec), and the exposure process is accomplished by scanning only one time, $1/L_y=0$ is substituted to the above-described equation (5) to obtain a mask velocity $V_m$ of 0.10 (μm/sec). Thus, it is required that the mask be moved at a velocity of 0.10 (μm/sec) in relation to the wafer in the same direction as that of the movements of the mask and the wafer during exposure.

Third Embodiment

Figure 6:
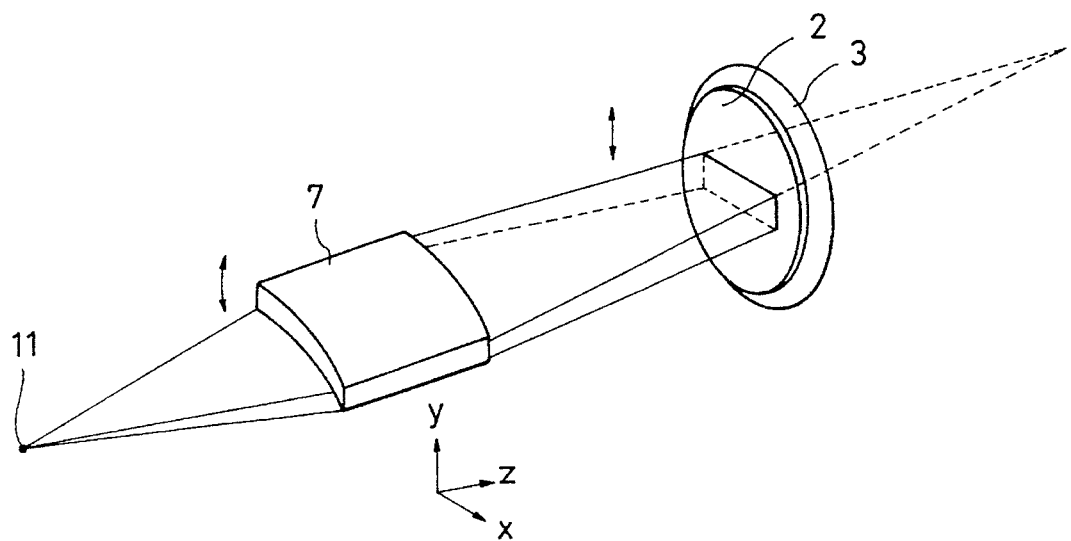
FIG. 6 illustrates an exposure apparatus according to still another embodiment of the present invention.

FIG. 6 illustrates an embodiment of an exposure apparatus having a convergent optical system upon an application of the present invention. In this embodiment, as well as in the first embodiment shown in FIG. 3, the magnification can be varied in accordance with a change in the proximity gap $\Delta g$, but it differs from the first embodiment in that the magnification correction in the X direction is performed in the direction opposite to that in the first embodiment. In other words, an increase in the proximity gap enlarges images in the first embodiment shown in FIG. 3, while it reduces images in this embodiment. Thus, a change in the proximity gap $\Delta g$ is substituted by $-\Delta g$ in the above-described equation (2) on the convergent X axis, while there is no change in $\Delta g$ on the divergent Y axis. In consequence, $\Delta g$ and $V_m$ can be expressed by the following equations:

$$\Delta g = -(m_x - 1) \times L_x \quad (6)$$

$$V_m = V_{sr} \times (m_y/(1 + \Delta g/L_y) - 1) \quad (7)$$

According to the above equations (6) and (7), the magnification is corrected in the X and Y directions in a manner similar to the first embodiment.

Fourth Embodiment

An explanation will further be given of an embodiment in which the magnification in the X direction is corrected utilizing thermal distortion of a wafer.

The following process is employed to perform the correction of the magnification in the X direction upon an application of thermal distortion to a wafer. (1) Measurements are first made on correction values $m_x$ and $m_y$ of the magnification in the X and Y directions in a manner similar to the first embodiment. For example, it will now be assumed that $m_x - 1 = 2.0E-6$ and $m_y - 1 = 3.0E-6$.

(2) When the coefficient of expansion of the linewidth of the wafer is indicated by $\alpha$, and the temperature of the wafer obtained during exposure is represented by $T_e$, the initial temperature $T_w$ of the wafer can be obtained by the following equation (8). It should be noted that at this time, consideration is only given to the correction of the magnification in the X direction.

$$T_w = T_e + (m_x - 1)/\alpha \quad (8)$$

It will be assumed that the coefficient of expansion of a wafer chuck is smaller than the wafer so that it can be negligible. For example, a Si wafer has a coefficient of expansion $\alpha$ of 2.4E-6 (1/° C.). Thus, when the temperature $T_e$ of the wafer obtained during exposure is 23.00° C. the initial temperature $T_w$ thereof results in 23.83° C.

(3) The temperature of the wafer is changed from $T_e$ to $T_w$ while the wafer is held on the wafer chuck. Such a change in the temperature neither expands nor contracts the wafer chuck, which further prevents the expansion and the contraction of the wafer, resulting in an application of a thermal stress to the wafer. (4) Subsequently, immediately after the wafer is temporarily removed from the wafer chuck, it is attached to the wafer chuck once again. When the wafer is removed from the chuck, the wafer is able to gain the magnification $m_x$ in correspondence with the temperature $T_w$, thus accomplishing the correction of the magnification. However, if exposure is performed on the wafer without being held on the wafer chuck, the temperature of the mask which is located in the proximity of the wafer would also become $T_w$, further incurring the distortion in the mask.

(5) Thus, while the wafer is held on the wafer chuck, the temperature of the wafer chuck is changed from $T_w$ to $T_e$. Since the coefficient of expansion of the linewidth of the wafer chuck is sufficiently smaller than that of the wafer, a change in the temperature from $T_w$ to $T_e$ does not substantially cause expansion or contraction of the wafer chuck.

The wafer is inclined to expand or contract at the exposure temperature $T_e$. However, the wafer is attached to the wafer chuck with a force greater than the expanding or contracting force of the wafer, with the result that the wafer can remain at the exposure temperature $T_e$ without changing its original dimensions which have been achieved at the temperature $T_w$, whereby a correction can be made to the magnification in the X direction.

Upon completion of the correction of the magnification in the X direction by the foregoing process, a correction will now be made to the magnification in the Y direction. This can be performed by relatively moving the mask in relation to the wafer in the scanning direction during exposure.

The velocity $V_m$ at which the mask is moved can be expressed by the following equation:

$$V_m = (m_y/m'_y - 1) \times V_{sr} \quad (9)$$

For example, if the following two conditions are satisfied: the mask and the wafer are moved at a velocity $V_{sr}$ of 50.0 (mm/sec), and the exposure process is accomplished by scanning only one time, a correction value of the magnification in the Y direction $m_y = 1 + 3.0E-6$ and $m'_y = m_x$ are substituted into the equation (9) so that the mask velocity $V_m$ can be expressed by the following equation (10):

$$V_m = 0.10 \ (\mu m/sec) \quad (10)$$

This equation shows that the mask is moved in relation to the wafer at a velocity of 0.10 ($\mu$m/sec) in the same direction as that of the movements of the mask and the wafer during exposure.

Fifth Embodiment

A fifth embodiment will further be explained with reference to FIG. 7. This embodiment performs the scanning exposure substantially by the following process. The radiation beam enlarged by a convex mirror is fixed to be oriented toward a mask and a wafer. A movable shutter having a predetermined-width opening is moved in the direction across the movement of the radiation beam.

Figure 7:
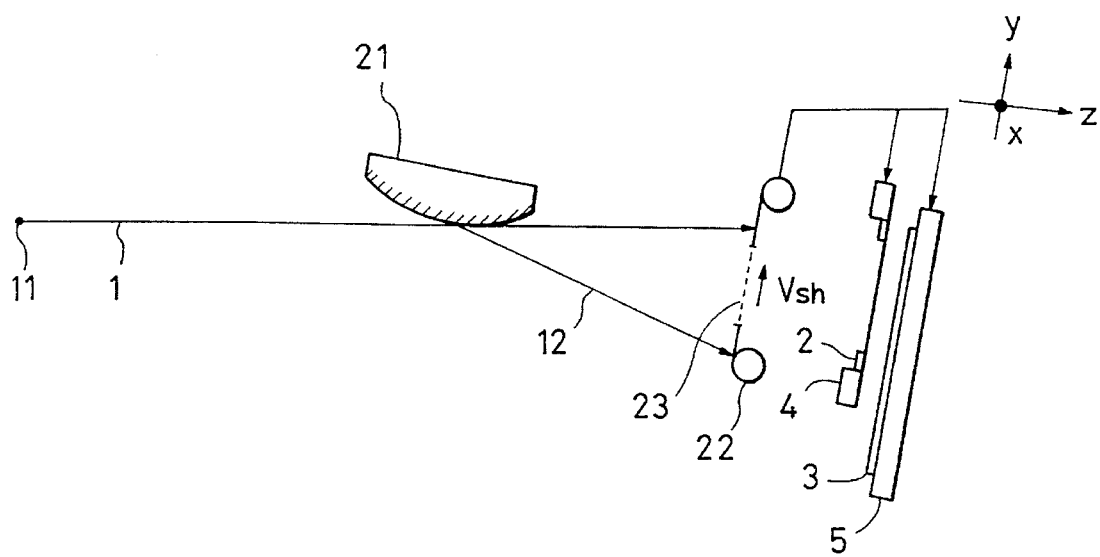
FIG. 7 illustrates an exposure apparatus according to a further embodiment of the present invention.

As shown in FIG. 7, the radiation beam 1 emitted from the light emission point 11 is enlarged by a convex mirror 21 and is oriented toward the X-ray mask 2. The intensity distribution of radiation light 12 enlarged by the convex mirror 21 is nonuniform, being generally shaped in the form of the Gaussian distribution in the enlarging direction (in the Y-axis direction in FIG. 7). The intensity distribution of the radiation beam 12 in the X-axis direction is substantially uniform.

In order to solve the above-described nonuniform distribution in the Y-axis direction, a shutter 22 is disposed to obtain the overall uniform distribution. The shutter 22 comprises a belt having a predetermined-width opening 23 and rotating drums for moving the belt in the Y-axis direction. In order to obtain uniform exposure in the exposure area on the mask which is irradiated with the radiation beam, the rotation speed of the rotating drums is controlled so as to vary the velocity of moving the opening of the belt, thus allowing each part of the exposure area to be exposed at a suitable exposure time. Although the enlarged radiation beam 12 is fixed with respect to the mask 2, the opening 23 of the shutter 22 is moved in the Y-axis direction, with the result that the radiation beam scans along the surface of the mask 2.

The radiation beam 12 is divergent from the light emission point 11 used as a point source in the X-axis direction, while it is divergent from the convex mirror 21 used as a point source in the Y-axis direction, thus resulting in a disparity in the transfer magnification between the X-axis and the Y-axis directions.

In order to solve the above-described problem, the mask stage 4 is moved synchronously with the movement of the opening 23 of the shutter 22, thus correcting the magnification in the Y-axis direction. On the other hand, as in the previously described embodiments, the correction in the X-axis direction (and in the Y-axis direction) can be performed by changing the proximity gap between the wafer and the mask or by adjusting the temperature of the wafer (or the mask).

A detailed explanation will now be given of the correction of the magnification in the Y-axis direction by moving the mask stage 4.

The velocity $V_s$ in the above-described equation (9) is substituted by the velocity $V_{sh}$ (in other words, the scanning velocity of the beam) of the opening 23 of the shutter 22 to obtain the velocity $V_m$ of the mask expressed by the following equation:

$$V_m = (m_y/m'_y - 1) V_{sh} \quad (11)$$

The exposure transfer is thus performed at this mask velocity $V_m$, thereby correcting the magnification in the Y-axis direction.

The opening 23 of the shutter 22 is moved at an inconsistent velocity according to a predetermined velocity profile depending on the intensity of the X-ray applied to the surface of the mask. Consequently, the mask velocity $V_m$ is varied according to the velocity $V_{sh}$ of the opening 23 of the shutter 22, while maintaining the relationship between the two components $V_m$ and $V_{sh}$ of the equation (11). When a change in the velocity of the shutter is relatively small, the velocity $V_m$ of the mask may be fixed at a constant value.

Sixth Embodiment

Figure 8:
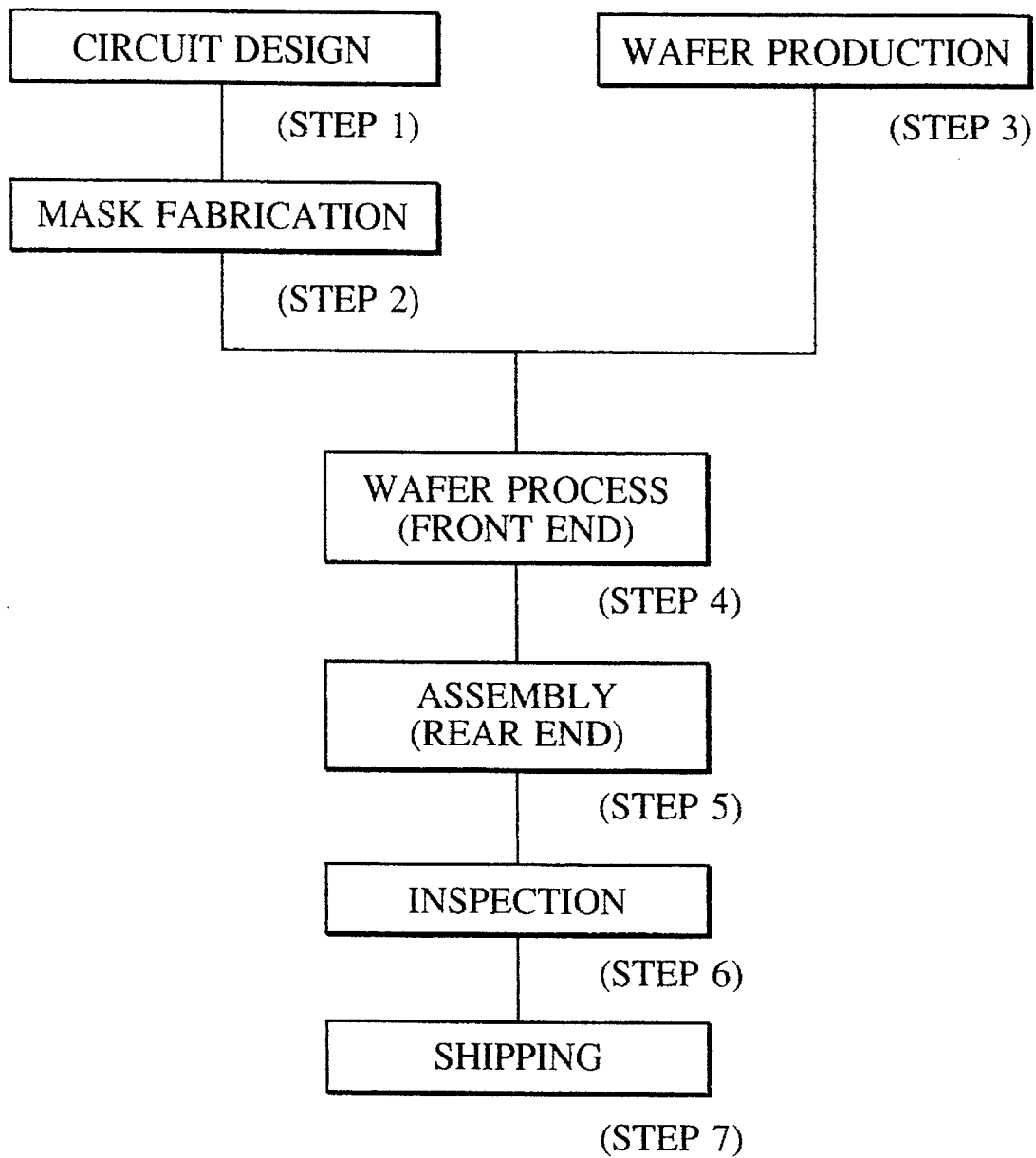
FIG. 8 illustrates a flow of manufacturing a semiconductor device.

A description will now be given of an embodiment of a process for manufacturing a device by use of one of the exposure apparatuses and exposure methods discussed above. FIG. 8 illustrates a flow of manufacturing microdevices (semiconductor chips, such as $IC_s$ or $LSI_s$ or the like, liquid crystal panels, $CCD_s$, thin film magnetic heads, micromachines and the like). A semiconductor device circuit is first designed in step 1 (circuit design). Then, a mask having the designed circuit pattern formed thereon is fabricated in step 2 (mask fabrication). Meanwhile, a wafer is produced by use of silicon or other types of materials in step 3 (wafer production). Step 4 (wafer process) is referred to as "a front end process" in which the previously-prepared mask and wafer are used to form an actual circuit on the wafer by a lithographic technique. A subsequent step 5 (assembly) is referred to as "a rear end process" including an assembly process (dicing and bonding), a packaging process (chip packaging) and other processes in which the wafer produced in step 4 is formed into semiconductor chips. In step 6 (inspection), inspections, such as an operation check test, a durability test and the like, are performed on the semiconductor devices manufactured in step 5. The semiconductor devices are thus manufactured through these processes and finally shipped in step 7.

Figure 9:
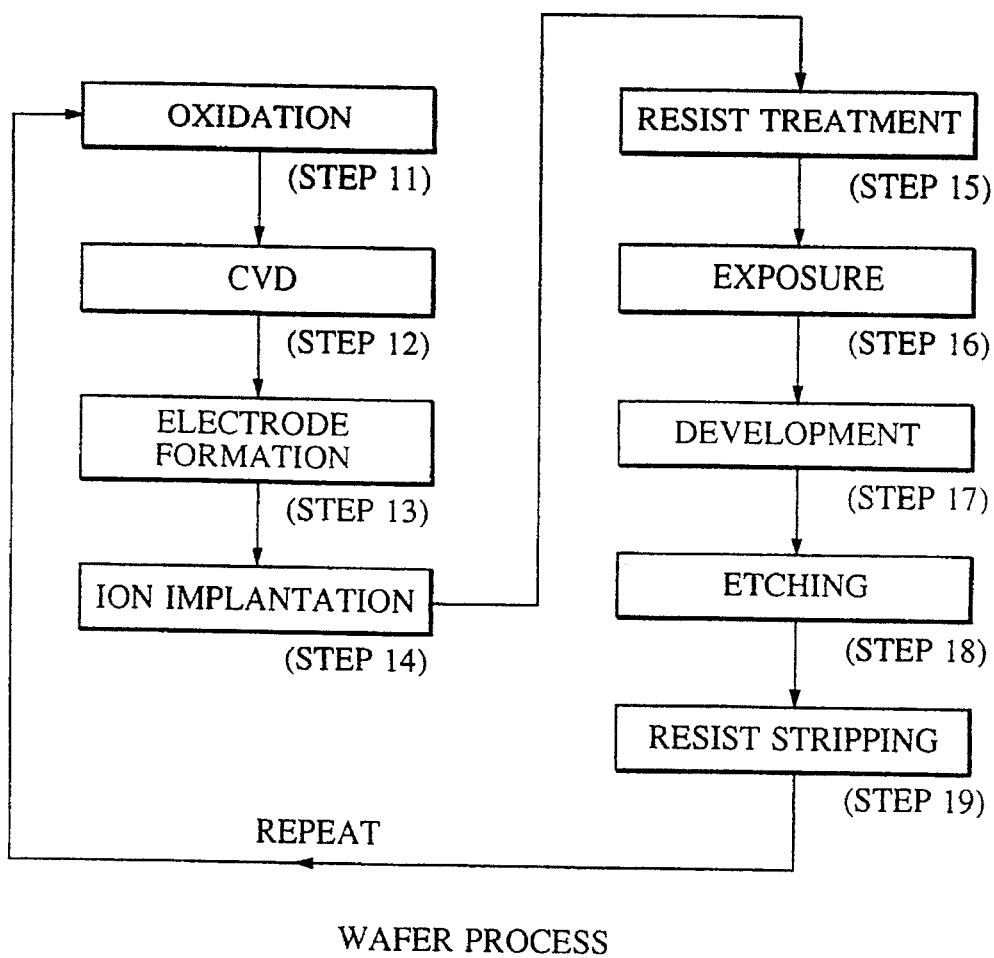
FIG. 9 illustrates a detailed flow of a wafer process.

FIG. 9 illustrates a detailed flow of the wafer process in step 4. The surface of the wafer is oxidized in step 11 (oxidization). An insulating film is then formed on the surface of the wafer in step 12 (CVD). In step 13 (electrode formation), an electrode is formed on the wafer by deposition, being followed by performing ion implantation on the wafer in step 14 (ion implantation). Subsequently, a photosensitive agent is applied to the wafer (resist processing) in step 15. In step 16 (exposure), the mask and wafer are exposed so that the circuit pattern formed on the mask is printed on the wafer by use of one of the previously-discussed exposure apparatuses and exposure methods, and the exposed wafer is then developed in step 17 (development). In step 18 (etching), etching is performed on the portions other than the developed resist image. Having been used to protect the insulating film from etching, the resist is then stripped in step 19 (resist stripping). These steps are repeated to form multilayered circuit patterns on the wafer. As is clearly seen from the foregoing description, by employing the manufacturing process of the present invention, it is possible to manufacture a highly-integrated semiconductor device which is conventionally difficult to fabricate.

While the present invention has been described with reference to what are presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

The individual components shown in outline or designated by blocks in the drawings are all well-known in the optical exposure arts, and their specific instruction and operation are not critical to the operation or best mode for carrying out the invention.

What is claimed is:

1. A method of transferring a pattern formed on a mask to a wafer by exposure with an X-ray beam, said method comprising the steps of:

positioning the mask and the wafer in a predetermined relation to each other;

relatively performing X-ray beam scanning in a scanning direction in relation to the mask and the wafer; and relatively moving the wafer and the mask in the scanning direction simultaneously with the beam scanning, so as to change the transfer magnification.

2. A method according to claim 1, wherein said beam scanning step is performed by deviating the beam with a scanning mirror.

3. A method according to claim 1, wherein said beam scanning step is performed by integrally moving the mask and the wafer.

4. A method according to claim 1, wherein said beam scanning step is performed by moving a shutter relative to the beam.

5. A method according to claim 1, wherein the beam comprises a synchrotron radiation beam.

6. A method according to claim 1, further comprising the step of adjusting a gap between the wafer and the mask.

7. A method according to claim 1, further comprising the step of adjusting the temperature of one of the wafer and the mask.

8. A device formed by a method of transferring a pattern formed on a mask to a wafer by exposure with an X-ray beam, said method comprising the steps of:

positioning the mask and the wafer in a predetermined relation to each other;

relatively performing X-ray beam scanning in a scanning direction in relation to the mask and the wafer; and relatively moving the wafer and the mask in the scanning direction simultaneously with the beam scanning, so as to change the transfer magnification.

9. A device according to claim 8, wherein said beam scanning step is performed by deviating the beam with a scanning mirror.

10. A device according to claim 8, wherein said beam scanning step is performed by integrally moving the mask and the wafer.

11. A device according to claim 8, wherein said beam scanning step is performed by moving a shutter relative to the beam.

12. A device according to claim 8, wherein the beam comprises a synchrotron radiation beam.

13. A device according to claim 8, further comprising the step of adjusting a gap between the wafer and the mask.

14. A device according to claim 8, further comprising the step of adjusting the temperature of one of the wafer and the mask.

* * * * *

UNITED STATES PATENT AND TRADEMARK OFFICE
CERTIFICATE OF CORRECTION

PATENT NO. : 5,604,779
DATED : February 18, 1997
INVENTOR(S) : MITSUAKI AMEMIYA, ET AL.

It is certified that error appears in the above-identified patent and that said Letters Patent is hereby corrected as shown below:

COLUMN 3

Line 1, "P2" should read --$P_2$--.
Line 12, "ratio my" should read --ratio $m_v$--.
Line 15, "$m_v=(L_m+L)/L_m$" should read --$m_v=(L_m+\Delta L)/L_m$--.

COLUMN 5

Line 39, "Velocity" should read --velocity--.

COLUMN 9

Line 17, "$IC_s$ or $LSI_s$" should read --ICs or LSIs--.
Line 18, "$CCD_s$," should read --CCDs,--.

Signed and Sealed this

Fifth Day of August, 1997

Attest:

BRUCE LEHMAN

Attesting Officer

Commissioner of Patents and Trademarks